United States Patent
Lee et al.

(10) Patent No.: US 12,112,866 B2
(45) Date of Patent: Oct. 8, 2024

(54) STACKED STRUCTURES FOR STRETCHABLE DEVICE, STRETCHABLE DEVICES, METHODS OF MANUFACTURING THE SAME, DISPLAY PANELS, SENSORS, AND ELECTRONIC DEVICES

(71) Applicant: Samsung Electronics Co., Ltd., Suwon-si (KR)

(72) Inventors: Yeongjun Lee, Seongnam-si (KR); Joo Young Kim, Hwaseong-si (KR); Youngjun Yun, Seongnam-si (KR); Hyun Bum Kang, Yongin-si (KR); Jong Won Chung, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 335 days.

(21) Appl. No.: 17/392,772

(22) Filed: Aug. 3, 2021

(65) Prior Publication Data

US 2022/0093287 A1    Mar. 24, 2022

(30) Foreign Application Priority Data

Sep. 24, 2020    (KR) .......................... 10-2020-0124014

(51) Int. Cl.
*H01B 5/14*    (2006.01)
*C23C 14/24*    (2006.01)
(Continued)

(52) U.S. Cl.
CPC .............. *H01B 5/14* (2013.01); *C23C 14/24* (2013.01); *H01B 5/16* (2013.01); *H01L 27/1218* (2013.01);
(Continued)

(58) Field of Classification Search
CPC .......... H01B 5/14; H01B 5/16; H01B 13/008; H01B 7/06; C23C 14/24; C23C 14/14;
(Continued)

(56) References Cited

U.S. PATENT DOCUMENTS 10,090,479 B2 * 10/2018 Kim ...................... H10K 50/16
10,161,737 B2    12/2018 Pegan et al.
(Continued)

FOREIGN PATENT DOCUMENTS

KR          101977862 B1    5/2019
KR       2020-0040152 A    4/2020
(Continued)

OTHER PUBLICATIONS

Jose Miguel Martin-Martinez, "Chapter 13—Rubber base adhesives" from Adhesion Science and Engineering, 2002, Elsevier, vol. 2, pp. 573-675, from https://doi.org/10.1016/B978-044451140-9/50013-5 (Year: 2002).*

(Continued)

*Primary Examiner* — Brian Handville
(74) *Attorney, Agent, or Firm* — Harness, Dickey & Pierce, P.L.C.

(57) ABSTRACT

A stacked structure for a stretchable device includes a stretchable layer including an elastic polymer, and a conductive layer on the stretchable layer and including a metal, wherein the stretchable layer includes a first depth region and a second depth region sequentially disposed in a depth direction from a surface of the stretchable layer that is in contact with the conductive layer and the first depth region includes the metal.

25 Claims, 18 Drawing Sheets

(51) Int. Cl.
*H01B 5/16* (2006.01)
*H01L 27/12* (2006.01)
*H01L 27/146* (2006.01)
*H01L 29/417* (2006.01)
*H01L 29/423* (2006.01)
*H01L 29/786* (2006.01)

(52) U.S. Cl.
CPC .... *H01L 27/1244* (2013.01); *H01L 27/14678* (2013.01); *H01L 29/41733* (2013.01); *H01L 29/42384* (2013.01); *H01L 29/78603* (2013.01)

(58) Field of Classification Search
CPC ............. H01L 27/1218; H01L 27/1244; H01L 27/14678; H01L 29/41733; H01L 29/42384; H01L 29/78603; Y02E 10/549; H10K 10/471; H10K 10/82; H10K 30/80; H10K 50/00; H10K 71/60; H10K 77/111
See application file for complete search history.

(56) References Cited

U.S. PATENT DOCUMENTS

| | | |
|---|---|---|
| 2014/0030532 A1 | 1/2014 | Byun et al. |
| 2017/0219331 A1* | 8/2017 | Pegan .................... G01L 1/2287 |
| 2018/0151301 A1* | 5/2018 | Fetzer .................... H10K 30/10 |
| 2018/0233250 A1* | 8/2018 | Taguchi ............. H01B 13/0036 |
| 2018/0246165 A1* | 8/2018 | Kim ........................ H01L 22/20 |
| 2019/0116658 A1* | 4/2019 | Jeong ..................... C09J 125/08 |
| 2021/0296554 A1* | 9/2021 | Ko .......................... H10N 10/81 |

FOREIGN PATENT DOCUMENTS

| | | |
|---|---|---|
| KR | 2020-0078176 A | 7/2020 |
| WO | WO-2015-130116 A1 | 9/2015 |

OTHER PUBLICATIONS

Korean Office Action issued on Aug. 28, 2024 for corresponding Korean Patent Application No. 10-2020-0124014 and English translation thereof.

* cited by examiner ated with about 0.001 Å/s.

STACKED STRUCTURES FOR STRETCHABLE DEVICE, STRETCHABLE DEVICES, METHODS OF MANUFACTURING THE SAME, DISPLAY PANELS, SENSORS, AND ELECTRONIC DEVICES

CROSS-REFERENCE TO RELATED APPLICATION

This application claims priority to and the benefit, under 35 U.S.C. § 119, of Korean Patent Application No. 10-2020-0124014 filed in the Korean Intellectual Property Office on Sep. 24, 2020, the entire contents of which are incorporated herein by reference.

BACKGROUND

(a) Field

Stacked structures for stretchable device, stretchable devices, methods of manufacturing the same, display panels, sensors, and electronic devices are disclosed.

(b) Description of the Related Art

In recent years, research on an attachable device for directly attaching a display device or a biological device such as a smart skin device, a soft robot, and a biomedical device to the skin or clothing is being conducted. Such an attachable device may be required to have stretchability to flexibly respond to motions of a living body and to be able to recover to its original state.

SUMMARY

Some example embodiments provide a stacked structure for a stretchable device that is applied to a stretchable device to increase stretching stability.

Some example embodiments provide a stretchable device that includes the stacked structure for a stretchable device and is capable of increasing stretching stability.

Some example embodiments provide a display panel including the stretchable device.

Some example embodiments provide a sensor including the stretchable device.

Some example embodiments provide an electronic device including the stretchable device, the display panel, or the sensor.

Some example embodiments provide a method of manufacturing the stretchable device.

According to some example embodiments, a stacked structure for a stretchable device includes a stretchable layer including an elastic polymer, and a conductive layer on the stretchable layer and including a metal, wherein the stretchable layer includes a first depth region and a second depth region sequentially disposed in a depth direction from a surface of the stretchable layer that is in contact with the conductive layer, and the first depth region includes the metal.

The elastic polymer may have a glass transition temperature of less than or equal to about 80° C. and greater than or equal to about −30° C.

The elastic polymer may be a copolymer including at least one hard structural unit and at least one soft structural unit, and a weight ratio of the hard structural unit to the soft structural unit may be less than about 1 and greater than or equal to about 0.01.

The hard structural unit may include a styrene structural unit, an olefin structural unit, a urethane structural unit, an ether structural unit, or a combination thereof, and the soft structural unit may include an ethylene structural unit, a propylene structural unit, a butylene structural unit, a isobutylene structural unit, a butadiene structural unit, an isoprene structural unit, or a combination thereof.

The metal may include gold (Au), silver (Ag), copper (Cu), chromium (Cr), rhodium (Rh), palladium (Pd), ruthenium (Ru), osmium (Os), iridium (Ir), platinum (Pt), an alloy thereof, or a combination thereof.

In the first depth region, the metal may be in the form of a metal cluster.

A thickness of the first depth region may be about 2 nm to about 100 nm.

The conductive layer may have a plurality of microcracks.

The conductive layer may be electrically connected to the metal in the first depth region of the stretchable layer.

According to some example embodiments, a stretchable device including the stacked structure for a stretchable device is provided.

The stretchable layer may be a stretchable substrate, and the conductive layer may include an electrode, a wiring, or a combination thereof.

The stretchable layer may be a stretchable gate insulating layer, a stretchable interlayer, a stretchable passivation layer, a stretchable protective layer, a stretchable buffer layer, or a combination thereof, and the conductive layer may include an electrode, a wiring, or a combination thereof.

The stretchable device may further include an active layer on and/or under the stacked structure for the stretchable device, and the active layer may include a light emitting layer, a light absorbing layer, a semiconductor, or a combination thereof.

According to some example embodiments, a display panel including the stretchable device is provided.

According to some example embodiments, a sensor including the stretchable device is provided.

According to some example embodiments, an electronic device including the display panel or the sensor is provided.

According to some example embodiments, a method of manufacturing a stretchable device includes preparing a stretchable layer including an elastic polymer, and thermally depositing a metal on the stretchable layer, wherein the thermally depositing of the metal includes penetrating or diffusing the metal into the stretchable layer to distribute the metal to a particular (or, alternatively, predetermined) depth from a surface of the stretchable layer, and stacking the metal on the stretchable layer to form a conductive layer.

The preparing of the stretchable layer may include preparing a copolymer including at least one hard structural unit and at least one soft structural unit and having a glass transition temperature of less than or equal to about 80° C. and greater than or equal to about −30° C.

In the thermally depositing of the metal, the thermally depositing of the metal may be performed in a deposition chamber where a temperature of the deposition chamber may be equal to or higher than a glass transition temperature of the elastic polymer.

In the thermally depositing of the metal, the temperature of the stretchable layer may be equal to or higher than the glass transition temperature of the elastic polymer.

In the thermally depositing of the metal, a thermal deposition rate may be less than or equal to about 10 Å/s and greater than or equal to about 0.001 Å/s.

In the thermally depositing of the metal, the thermal deposition rate may be about 0.001 Å/s to about 1 Å/s.

The method may further include forming an active layer under and/or on the stretchable layer or under and/or on the conductive layer, and the active layer may include a light emitting layer, a light absorbing layer, a semiconductor, or a combination thereof.

The stretchable layer may be a stretchable substrate, and the conductive layer may include an electrode, a wiring, or a combination thereof.

The stretchable layer may be a stretchable gate insulating layer, a stretchable interlayer, a stretchable passivation layer, a stretchable protective layer, a stretchable buffer layer, or a combination thereof, and the conductive layer may include an electrode, a wiring, or a combination thereof.

An adhesion between the stretchable layer and the conductive layer may be increased, and thus damage caused by stretching may be reduced and electrical stability may be improved.

DETAILED DESCRIPTION

Figure 1:
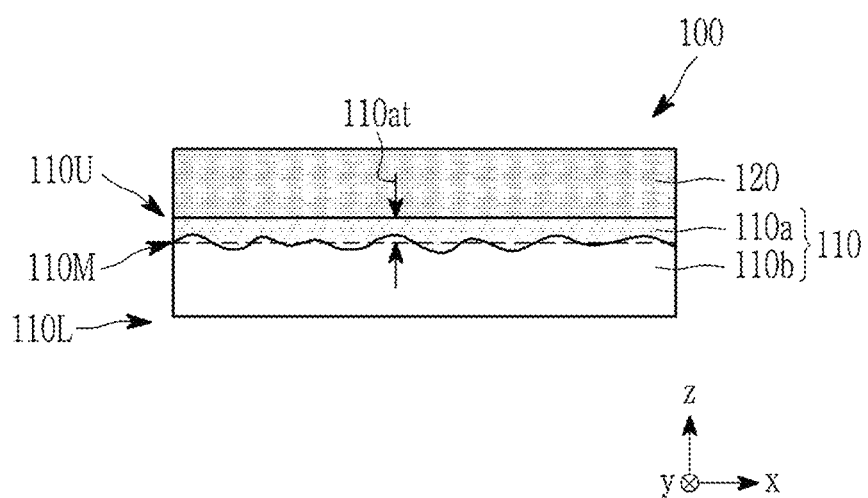
FIG. 1 is a cross-sectional view showing an example of a stacked structure for a stretchable device according to some example embodiments.

Hereinafter, some example embodiments will be described in detail so that those of ordinary skill in the art can easily implement them. However, a structure that is actually applied may be implemented in various different forms, and is not limited to the example embodiments described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present (e.g., the element may be isolated from direct contact with the other element). In contrast, when an element is referred to as being "directly on" another element, there are no intervening elements present. It will be understood that when an element such as a layer, film, region, or substrate is referred to as being "on" another element, it may be above or under the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, "combination" includes mixing or a stacked structure of two or more.

Hereinafter, a stacked structure for a stretchable device according to some example embodiments will be described with reference to the drawings.

The stacked structure for a stretchable device may be a constituent element that is included in or applied to a stretchable device. The stacked structure for a stretchable device is, for example, a constituent element included in a stretchable device, and may be a stack in which an insulating structure and a conductive structure are in contact.

Figure 2:
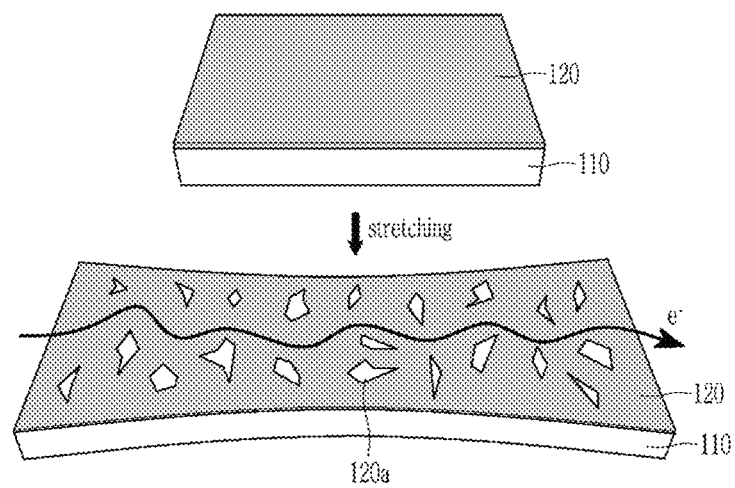
FIG. 2 is a schematic perspective view showing an electrical passage in a conductive layer during stretching in the stacked structure for a stretchable device of FIG. 1.

FIG. 1 is a cross-sectional view showing an example of a stacked structure for a stretchable device according to some example embodiments and FIG. 2 is a schematic plan view showing an electrical passage in a conductive layer during stretching in the stacked structure for a stretchable device of FIG. 1.

Referring to FIG. 1, the stacked structure 100 for a stretchable device according to some example embodiments includes a stretchable layer 110 and a conductive layer 120 on (e.g., directly or indirectly on) the stretchable layer 110.

The stretchable layer 110 may be stretched in a particular (or, alternatively, predetermined) direction and may have stretchability that is recovered again, and may flexibly respond to external force or external movement such as twisting, pressing, and pulling in a particular (or, alternatively, predetermined) direction.

The stretchable layer 110 may have a relatively low elastic modulus, and the elastic modulus of the stretchable layer 110 may be, for example, greater than or equal to about $10^2$ Pa and less than about $10^8$ Pa, and within the above range, greater than or equal to about $10^2$ Pa to about $10^7$ Pa, greater than or equal to about $10^2$ Pa to about $10^6$ Pa, or greater than or equal to about $10^2$ Pa to about $10^5$ Pa. Herein, the elastic modulus may be, for example, Young's modulus.

The stretchable layer 110 may have an elongation of greater than or equal to about 50%, and within the above range, greater than or equal to about 80%, greater than or equal to about 100%, greater than or equal to about 120%, greater than or equal to about 150%, greater than or equal to about 200%, greater than or equal to about 250%, or greater than or equal to about 300%, and within this range about 50% to about 1000%, about 80% to about 1000%, about 100% to about 1000%, about 120% to about 1000%, about 150% to about 1000%, about 200% to about 1000%, about 250% to about 1000%, or about 300% to about 1000%. Here, the elongation may be a percentage of a change in length that increases from an initial length to a breaking point.

The stretchable layer 110 may include an elastic polymer. The elastic polymer may be, for example, a thermoplastic elastomer, a thermosetting elastomer, or a combination thereof, and may include a plurality of structural units that are the same or different from each other.

As an example, the elastic polymer may be a thermoplastic elastic polymer including at least one hard structural unit providing relatively hard (rigid) properties to the elastic polymer and at least one soft structural unit providing relatively soft properties to the elastic polymer. The hard structural unit may not be stretchable and may crosslink adjacent polymer chains and/or molecules and the soft structural unit may be stretchable to provide a stretchability to the elastic polymer. For example, a glass transition temperature of the hard structural unit may be greater than or equal to a room temperature (about 25° C.) and a glass transition temperature of the soft structural unit may be less than a room temperature. As an example, the elastic polymer may be a copolymer including at least one hard structural unit providing relatively hard (rigid) properties to the elastic polymer and at least one soft structural unit providing relatively soft properties to the elastic polymer. The hard structural unit may provide, for example, plastic properties such as high-temperature performance, thermoplastic processability, tensile strength, and tear strength to the elastic polymer, and the soft structural unit may provide, for example, elastic properties such as low-temperature performance, hardness, flexibility, and tension/compression to the elastic polymer. The hard structural unit and the soft structural unit may be alternately arranged in the elastic polymer, or may be arranged in clusters or blocks.

The hard structural unit may include, for example, a styrene-containing structural unit (hereinafter referred to as a "styrene structural unit"), an olefin-containing structural unit (hereinafter referred to as an "olefin structural unit"), an urethane-containing structural unit (hereinafter referred to as an "urethane structural unit"), an ether-containing structural unit (hereinafter referred to as an "ether structural unit"), or a combination thereof, but is not limited thereto.

The soft structural unit may include, for example, an ethylene-containing structural unit (hereinafter referred to as an "ethylene structural unit"), a propylene-containing structural unit (hereinafter referred to as a "propylene structural unit"), a butylene-containing structural unit (hereinafter referred to as a "butylene structural unit"), an isobutylene-containing structural unit (hereinafter referred to as an "isobutylene structural unit"), a butadiene-containing structural unit (hereinafter referred to as a "butadiene structural unit"), isoprene-containing structural unit (hereinafter referred to as an "isoprene structural unit"), or a combination thereof, but is not limited thereto.

As an example, the hard structural unit may be a styrene structural unit, and the soft structural unit may include an ethylene structural unit, a propylene structural unit, a butylene structural unit, an isobutylene structural unit, a butadiene structural unit, an isoprene structural unit, or a combination thereof.

For example, the elastic polymer may include a styrene-butadiene rubber SBR, styrene-ethylene-butylene-styrene SEBS, styrene-ethylene-propylene-styrene, styrene-ethylene-propylene-styrene SEPS, styrene-butadiene-styrene SBS, styrene-isoprene-styrene SIS, styrene-isobutylene-styrene SIBS, or a combination thereof.

The elastic polymer may have a relatively low glass transition temperature (Tg). In this way, since the stretchable layer 110 includes an elastic polymer having a relatively low glass transition temperature, it is possible to facilitate penetration and/or diffusion of metal through the surface and inside of the stretchable layer 110 due to increased flexibility and free volume of the elastic polymer chains during the process of thermally depositing the conductive layer 120 on the stretchable layer 110 to be described layer.

A glass transition temperature of the elastic polymer may be, for example, less than or equal to about 80° C., and within the above range, less than or equal to about 75° C., less than or equal to about 70° C., less than or equal to about 65° C., or less than or equal to about 60° C., and for example, greater than or equal to about −30° C., greater than or equal to about 20° C., greater than or equal to about −10° C., greater than or equal to about 0° C., greater than or equal to about 5° C., greater than or equal to about 10° C., greater than or equal to about 20° C., greater than or equal to about 25° C., or greater than or equal to about 30° C., and within the above range about −30° C. to about 80° C., about −30° C. to about 75° C., about −30° C. to about 70° C., about −30° C. to about 65° C., or about −30° C. to about 60° C.

As described above, the elastic polymer having a relatively low glass transition temperature may be obtained by controlling a ratio of the structural unit having a relatively high glass transition temperature to the structural unit having a relatively low glass transition temperature. For example, the structural unit having a relatively high glass transition temperature may be selected from the aforementioned hard structural units, and the structural unit having a relatively low glass transition temperature may be selected from the aforementioned soft structural units. For example, a weight ratio of the hard structural unit to the soft structural unit of the elastic polymer may be less than about 1, and within this range, less than or equal to about 0.9, less than or equal to about 0.8, less than or equal to about 0.7, less than or equal to about 0.6, less than or equal to about 0.5, less than or equal to about 0.4, or less than or equal to about 0.3, and/or greater than or equal to about 0.01, and may be about 0.01 to about 0.9, about 0.01 to about 0.8, about 0.01 to about 0.7, about 0.01 to about 0.6, about 0.01 to about 0.5, about 0.01 to about 0.4, about 0.01 to about 1, or about 0.01 to about 0.3.

For example, the elastic polymer may be styrene-ethylene-butylene-styrene (SEBS) including a styrene structural unit as a hard structural unit and an ethylene structural unit and a butylene structural unit as a soft structural unit. By controlling a weight ratio of the styrene structural unit to the ethylene structural unit and the butylene structural unit, the elastic polymer having a relatively low glass transition temperature of, for example, less than or equal to about 80° C. may be obtained. For example, in the styrene-ethylene-butylene-styrene (SEBS), the weight ratio of the styrene structural unit to the ethylene structural unit and the butylene structural unit may be less than about 1, within the range, less than or equal to about 0.9, less than or equal to about 0.8, less than or equal to about 0.7, less than or equal to about 0.6, less than or equal to about 0.5, less than or equal to about 0.4, or less than or equal to about 0.3, about 0.01 to about 0.9, about 0.01 to about 0.8, about 0.01 to about 0.7, about 0.01 to about 0.6, about 0.01 to about 0.5, about 0.01 to about 0.4, or about 0.01 to about 0.3.

The stretchable layer 110 may have (e.g., may include) a first depth region 110a and a second depth region 110b sequentially disposed along a depth direction (e.g., z direction) from an upper surface 110U of the stretchable layer 110 that is in contact (e.g., direct contact) with the conductive layer 120. The first depth region 110a may be a region from the upper surface 110U in contact with the conductive layer 120 to a particular (or, alternatively, predetermined) depth and the second depth region 110b may be a region from a boundary 110M with the first depth region 110a to the lower surface 110L of the stretchable layer 110. The first depth region 110a and the second depth region 110b may be determined according to whether a metal to be described later is included or not, and the boundary 110M between the first depth region 110a and the second depth region 110b may be a boundary through which the metal is penetrated and/or diffused when the metal for the conductive layer 120 is thermally deposited to be described later. A thickness of the first depth region 110a may not be constant depending on the location thereof.

The first depth region 110a of the stretchable layer 110 may include a metal. The metal included in the first depth region 110a of the stretchable layer 110 may be derived from metal atoms that are penetrated or diffused through the upper surface 110U of the stretchable layer 110 when the metal for the conductive layer 120 is thermally deposited to be described later. Accordingly, the type of metal included in the first depth region 110a of the stretchable layer 110 may be the same as the type of metal included in the conductive layer 120.

The metal may be selected from metals having low reactivity, and may be, for example, inactive metals (noble metals) such as gold (Au), silver (Ag), copper (Cu), chromium (Cr), rhodium (Rh), palladium (Pd), ruthenium (Ru), osmium (Os), iridium (Ir), platinum (Pt), an alloy thereof, or a combination thereof may be included, but the present inventive concepts are not limited thereto.

For example, the metal atoms penetrated and/or diffused through the upper surface 110U of the stretchable layer 110 may be aggregated with each other to form metal clusters. Accordingly, at least some of the metals in the first depth region 110a of the stretchable layer 110 may be present in the first depth region 110a in the form of metal clusters.

The first depth region 110a of the stretchable layer 110 may have a thickness 110at of, for example, about 2 nm to about 100 nm, and within the above range, about 2 nm to about 70 nm, about 2 nm to about 50 nm, about 2 nm to about 40 nm, about 2 nm to about 30 nm, about 2 nm to about 25 nm, about 2 nm to about 20 nm, about 2 nm to about 15 nm, or about 2 nm to about 10 nm. In some example embodiments, thickness 110at may be an average thickness of the first depth region 110a. In some example embodiments, thickness 110at may refer to a distance in the depth direction (e.g., z direction) between upper surface 110U and boundary 110M at any given point in the x and/or z directions along the stretchable layer 110, where the magnitude of thickness 110at may be constant or may be variable within any of the ranges described above in the x and/or z directions along the stretchable layer 110.

The conductive layer 120 may be a metal layer formed on the stretchable layer 110 with a particular (or, alternatively, predetermined) thickness. The conductive layer 120 may include a metal of the same type (e.g., a same metal) as the metal included in the first depth region 110*a* of the stretchable layer 110. The conductive layer 120 may include, for example, a metal that is an inactive metal (a noble metal), such as gold (Au), silver (Ag), copper (Cu), chromium (Cr), rhodium (Rh), palladium (Pd), ruthenium (Ru), osmium (Os), iridium (Ir), platinum (Pt); an alloy thereof; or a combination thereof, but the present inventive concepts are not limited thereto.

The conductive layer 120 may be a deposited thin film formed by thermal deposition as described below, and may be a fine pattern having a particular (or, alternatively, predetermined) width and length. For example, the conductive layer 120 may have an island shape, a linear shape, or a wavy shape, but is not limited thereto.

Referring to FIG. 2, the conductive layer 120 may have a plurality of microcracks 120*a*, and the plurality of microcracks 120*a* may expand and increase along a stretching direction during stretching. The plurality of microcracks 120*a* may be intentionally or unintentionally formed during the process of forming the conductive layer 120 or the process of stretching the conductive layer 120. The plurality of microcracks 120*a* may impart flexibility or stretchability to the conductive layer 120 to prevent or reduce the conductive layer 120 from cracking or cracking during stretching. In addition, since the microcracks 120*a* are separated from each other like small holes in the conductive layer 120, unlike general linear cracks, the passage P of the current of the conductive layer 120 during stretching may be connected continuously without being blocked by the microcracks 120*a*. Accordingly, electrical stability may be secured without damaging the electrical passage through stretching.

The conductive layer 120 may be electrically connected to metals (for example, metal clusters) in the first depth region 110*a* of the stretchable layer 110. For example, the conductive layer 120 may be in contact with at least a portion of the metals (for example, metal clusters) in the first depth region 110*a* of the stretchable layer 110. Therefore, it is possible to increase the adhesion between the conductive layer 120 and the upper surface 110U of the stretchable layer 110, thereby preventing the conductive layer 120 from being peeled off or detached from the stretchable layer 110 during stretching and effectively preventing an electric short circuit. In addition, since the metals (e.g., metal clusters) in the first depth region 110*a* of the stretchable layer 110 may also serve as an electrical passage, stable electrical characteristics may be maintained even during stretching.

For example, the stretchable layer 110 may be a stretchable substrate supporting the conductive layer 120. As an example, the conductive layer 120 may be, for example, an electrode, a wiring, or a combination thereof on a stretchable substrate. For example, it may be an anode, a cathode, a pixel electrode, a common electrode, a gate electrode, a source electrode, a drain electrode, a connection electrode, a gate line, a data line, a driving voltage line, a common voltage line, a connection electrode line, an auxiliary line, or a combination thereof, but the present inventive concepts are not limited thereto.

For example, the stretchable layer 110 may be a stretchable insulating layer, for example a stretchable gate insulating layer, a stretchable interlayer, a stretchable passivation layer, a stretchable protective layer, a stretchable buffer layer, or a combination thereof. As an example, the conductive layer 120 may be, for example, an electrode, a wiring, or a combination thereof on a stretchable insulating layer. For example, the conductive layer 120 may be an anode, a cathode, a pixel electrode, a common electrode, a gate electrode, a source electrode, a drain electrode, a connection electrode, a gate line, a data line, a driving voltage line, a common voltage line, a connection electrode line, an auxiliary line, or a combination thereof, but the present inventive concepts are not limited thereto.

The stacked structure 100 for a stretchable device may flexibly respond to external force or external movement such as twisting, pressing, and pulling in a particular (or, alternatively, predetermined) direction due to the stretchable layer 110 and at the same time, damages caused by such external force or external movement may be effectively reduced or prevented and an electrical passage may be stably secured, thereby effectively increasing electrical stability according to stretching.

Figure 19:
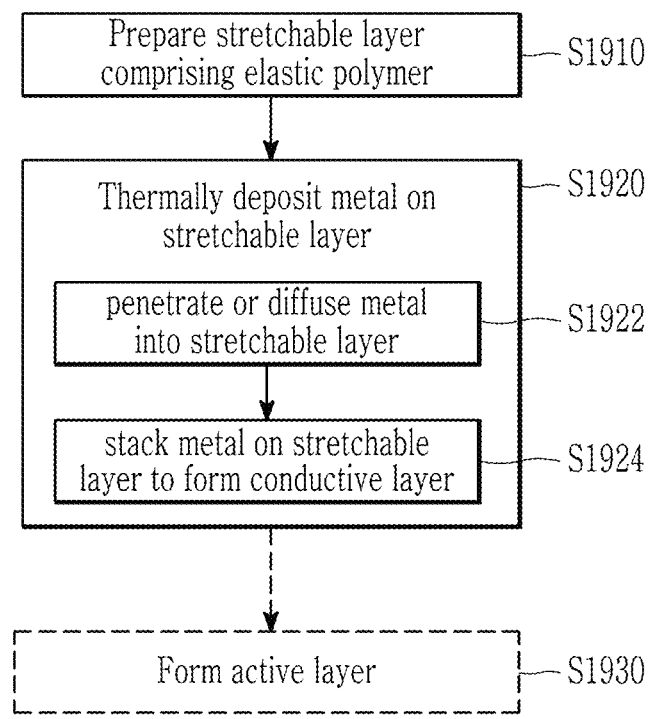
FIG. 19 is a flowchart illustrating a method of manufacturing a stretchable device according to some example embodiments.

FIG. 19 is a flowchart illustrating a method of manufacturing a stretchable device according to some example embodiments. The stacked structure 100 for a stretchable device may be formed by thermally depositing a metal on the stretchable layer 110 as described above. For example, as shown at FIG. 19 a method of manufacturing the stacked structure 100 for a stretchable device may include preparing (e.g., forming) the stretchable layer 110 (S1910) and thermally depositing a metal on the stretchable layer 110 (e.g., on the upper surface 110U) to form the conductive layer 120 (S1920). The stretchable layer 110 prepared at S1910 may be a stretchable substrate according to any of the example embodiments, and the conductive layer formed at S1920 may include an electrode, a wiring, or a combination thereof according to any of the example embodiments. The stretchable layer 110 prepared at S1910 may be a stretchable gate insulating layer, a stretchable interlayer, a stretchable passivation layer, a stretchable protective layer, a stretchable buffer layer, or a combination thereof according to any of the example embodiments, and the conductive layer formed at S1920 may include an electrode, a wiring, or a combination thereof according to any of the example embodiments.

The preparing of the stretchable layer 110 at S1910 may be obtained by (e.g., may include) applying (e.g., preparing) an elastic polymer solution including an elastic polymer, for example, by a solution process such as spin coating, curing, and selectively patterning. The elastic polymer solution may further include, for example, a curing agent. The elastic polymer is as described above (e.g., may include at least one hard structural unit and at least one soft structural unit), and may be, for example, obtained by copolymerization of a monomer or an oligomer for at least one hard structural unit and a monomer or an oligomer for at least one soft structural unit at a particular (or, alternatively, predetermined) ratio to prepare preparing a copolymer comprising at least one hard structural unit and at least one soft structural unit such that the glass transition temperature of the copolymer may be less than or equal to about 80° C. (e.g., about −30° C. to about 80° C.) or may be any of the glass transition temperatures of a copolymer according to any of the example embodiments. For example, the weight ratio of the monomer or oligomer for the at least one hard structural unit to the monomer or oligomer for the at least one soft structural unit may be less than about 1, within the range, less than or equal to about 0.9, less than or equal to about 0.8, less than or equal to about 0.7, less than or equal to about 0.6, less than or equal to about 0.5, less than or equal to about 0.4, or less than or equal to about 0.3, greater than or equal to about 0.01, about 0.01 to about 0.9, about 0.01 to about 0.8, about 0.01 to about 0.7, about 0.01 to about 0.6, about 0.01 to about 0.5, about 0.01 to about 0.4, or about 0.01 to about 0.3.

The forming of the conductive layer 120 may be performed by a method of forming a thin film in a deposition chamber at a temperature equal to or higher than the glass transition temperature of the elastic polymer, and may be performed, for example, by thermal deposition, for example vacuum thermal deposition. Accordingly, the thermally depositing of the metal at S1920 may be performed in a deposition chamber (such as a vacuum chamber) where a temperature of (e.g., temperature within) the deposition chamber is equal to or higher than a glass transition temperature of the elastic polymer. As an example, the forming of the conductive layer 120 may include preparing a boat or crucible including a metal sample and a thermal depositor in which the stretchable layer 110 is disposed to face each other in a deposition chamber such as a vacuum chamber, applying heat to the boat or crucible to evaporate and to thermally deposit a metal on a surface (e.g., the upper surface 110U) of the stretchable layer 110. The heat applied to the boat or crucible may be, for example, resistive heat.

For example, in the applying of heat to a boat or crucible, the temperature inside the vacuum chamber may be increased due to radiant heat generated by heat, and the temperature of the vacuum chamber may be equal to or higher than the glass transition temperature of the elastic polymer. In addition, in the applying of heat to the boat or crucible, the surface temperature of the stretchable layer 110 may also be increased by radiant heat generated by heat, and the surface temperature of the stretchable layer 110 at this time may be, for example, equal to or higher than the glass transition temperature of the elastic polymer. Accordingly, in the thermally depositing of the metal at S1920, a temperature of a surface (e.g., the upper surface 110U) of the stretchable layer 110 may be equal to or higher than the glass transition temperature of the elastic polymer. In this way, as the temperature of the vacuum chamber and/or the surface temperature of the stretchable layer 110 are increased, flexibility and free volume of the elastic polymer chain of the stretchable layer 110 may be increased, and the penetration and/or diffusion of the metal into the stretchable layer 110 may be increased.

An amount of metals that are penetrated and/or diffused into the stretchable layer 110 may be controlled by, for example, a deposition rate. For example, when depositing at a slow deposition rate for a long time, the depth (first depth region 110a) at which metal atoms are diffused may be relatively deep. For example, when depositing at a high deposition rate, the depth (first depth region 110a) at which metal atoms are diffused may be relatively shallow. For example, the deposition rate of the metal may be, for example, greater than or equal to about 0.001 Å/s, greater than or equal to about 0.002 Å/s, greater than or equal to about 0.005 Å/s, greater than or equal to about 0.007 Å/s, greater than or equal to about 0.01 Å/s, greater than or equal to about 0.002 Å/s, greater than or equal to about 0.005 Å/s, or greater than or equal to about 0.007 Å/s, and for example less than or equal to about 20 Å/s, within the range, less than or equal to about 15 Å/s, less than or equal to about 10 Å/s, less than or equal to about 5 Å/s, less than or equal to about 3 Å/s, less than or equal to about 2 Å/s, less than or equal to about 1 Å/s, less than or equal to about 0.5 Å/s, less than or equal to about 0.4 Å/s, less than or equal to about 0.3 Å/s, less than or equal to about 0.2 Å/s, or less than or equal to about 0.1 Å/s, within the range, about 0.001 Å/s to about 20 Å/s, about 0.001 Å/s to about 15 Å/s, about 0.001 Å/s to about 10 Å/s, about 0.001 Å/s to about 5 Å/s, about 0.001 Å/s to about 3 Å/s, about 0.001 Å/s to about 2 Å/s, about 0.001 Å/s to about 1 Å/s, about 0.001 Å/s to about 0.5 Å/s, about 0.001 Å/s to about 0.4 Å/s, about 0.001 Å/s to about 0.3 Å/s, about 0.001 Å/s to about 0.2 Å/s, or about 0.001 Å/s to about 0.1 Å/s. Accordingly, in the thermally depositing of the metal at S1920 (e.g., the penetrating or diffusing at S1922), the thermal deposition rate may be less than or equal to about 10 Å/s (e.g., less than or equal to about 10 Å/s and greater than or equal to about 0.001 Å/s).

Metal atoms that are initially evaporated in the thermally depositing the metal may be easily penetrated and/or diffused into the surface of the stretchable layer 110 having a relatively low glass transition temperature to move into inside the stretchable layer 110 (S1922). Accordingly, it may be distributed in a region from the surface of the stretchable layer 110 to a particular (or, alternatively, predetermined) depth. Meanwhile, as the amount of metal atoms moved into the stretchable layer 110 is increased, at least a portion of the metal atoms may be aggregated with adjacent metal atoms and distributed in the form of metal clusters. When saturated by metal atoms and metal clusters at a particular (or, alternatively, predetermined) depth from the surface (e.g., upper surface 110U) of the stretchable layer 110, penetration and/or diffusion of the metal atoms into the stretchable layer 110 may stop and the conductive layer 120 may be stacked on the surface of the stretchable layer 110 (S1922). Accordingly, it will be understood that thermally depositing a metal on the stretchable layer (e.g., on the upper surface 110U) at S1920 may include penetrating or diffusing the metal into the stretchable layer to distribute the metal to a particular depth from a surface (e.g., upper surface 110U) of the stretchable layer (S1922), and stacking the metal on the stretchable layer (e.g., on the upper surface 110U subsequent to the penetrating or diffusing at S1922) to form a conductive layer (S1924).

The stacked structure 100 for a stretchable device may be applied to various stretchable devices. The stretchable device may include, for example, a light emitting device, a light absorbing device, a transistor, a resistance device, an imaging device, or a combination thereof, but is not limited thereto.

The stretchable device may further include at least one active layer under and/or on the stretchable layer 110 or under and/or on the conductive layer 120, and thus on or under the stacked structure 100, according to some example embodiments. The active layer may include, for example, a light emitting layer, a light absorbing layer, a semiconductor, or a combination thereof, but is not limited thereto. The method shown in FIG. 19 may include, in some example embodiments, forming an active layer under and/or on the stretchable layer 110 or under and/or on the conductive layer 120 and thus under and/or on the stretchable device (S1930), wherein the active layer comprises a light emitting layer, a light absorbing layer, a semiconductor, or a combination thereof.

Hereinafter, various examples of a stretchable device including the aforementioned stacked structure 100 for stretchable devices will be described.

Figure 3:
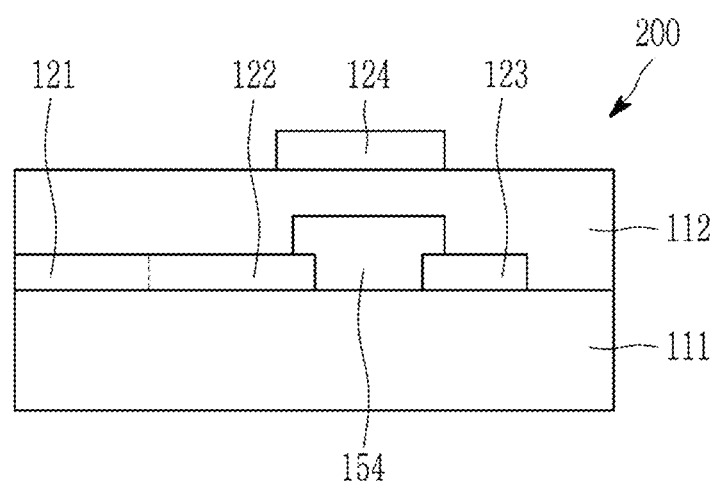
FIG. 3 is a cross-sectional view showing an example of a stretchable device according to some example embodiments.

FIG. 3 is a cross-sectional view showing an example of a stretchable device according to some example embodiments.

The stretchable device according to some example embodiments may be a stretchable thin film transistor.

Referring to FIG. 3, a stretchable device 200 according to some example embodiments includes a stretchable substrate 111, a source electrode 122, a drain electrode 123, a semiconductor 154, a gate insulating layer 112, and a gate electrode 124.

The stretchable substrate 111 may be, for example, a support substrate including an elastic polymer.

The source electrode 122 and the drain electrode 123 are separated from each other at a particular (or, alternatively, predetermined) interval on the stretchable substrate 111, and the source electrode 122 is connected to the data line 121. The source electrode 122, the drain electrode 123, and the data line 121 may include, for example, gold (Au), silver (Ag), copper (Cu), rhodium (Rh), palladium (Pd), ruthenium (Ru), and osmium (Os), iridium (Ir), platinum (Pt), an alloy thereof, or a combination thereof, but are not limited thereto.

The semiconductor 154 may be electrically connected to the source electrode 122 and the drain electrode 123 on the source electrode 122 and the drain electrode 123. The semiconductor 154 may include, for example, an organic semiconductor material and optionally an elastomer, and may be, for example, a stretchable semiconductor.

The gate insulating layer 112 may be between the semiconductor 154 and the gate electrode 124 and may cover the whole surface of the stretchable substrate 111. The gate insulating layer 112 may include, for example, an elastic polymer.

The gate electrode 124 is on the gate insulating layer 112 to be overlapped with the semiconductor 154 and is connected to a gate line (not shown). The gate electrode 124 may include, for example, gold (Au), silver (Ag), copper (Cu), rhodium (Rh), palladium (Pd), ruthenium (Ru), osmium (Os), iridium (Ir), platinum (Pt), an alloy thereof, or a combination thereof, but is not limited thereto.

As an example, in the stretchable device 200 shown in FIG. 3, the stacked structure of the stretchable substrate 111 and the data line 121, the source electrode 122, and/or the drain electrode 123 may be the aforementioned stacked structure 100. That is, the stretchable substrate 111 may be the aforementioned stretchable layer 110 and the data line 121, the source electrode 122, and/or the drain electrode 123 may be the aforementioned conductive layer 120.

For example, in the stretchable device 200 shown in FIG. 3, the stacked structure of the gate insulating layer 112 and the gate electrode 124, and/or the gate line may be the aforementioned stacked structure 100. That is, the gate insulating layer 112 may be the aforementioned stretchable layer 110 and the gate electrode 124 and/or the gate line (not shown) may be the aforementioned conductive layer 120.

The stretchable device 200 according to some example embodiments may flexibly respond to external force or external movement such as twisting, pressing, and pulling in a particular (or, alternatively, predetermined) direction by including the aforementioned at least one stacked structure 100 for a stretchable device, and at the same time, damages caused by such external force or external movement may be effectively reduced or prevented, and an electrical passage may be stably secured, by increasing adhesion between the stretchable layer 110 and the conductive layer 120, thereby effectively increasing electrical stability according to stretching.

Figure 4:
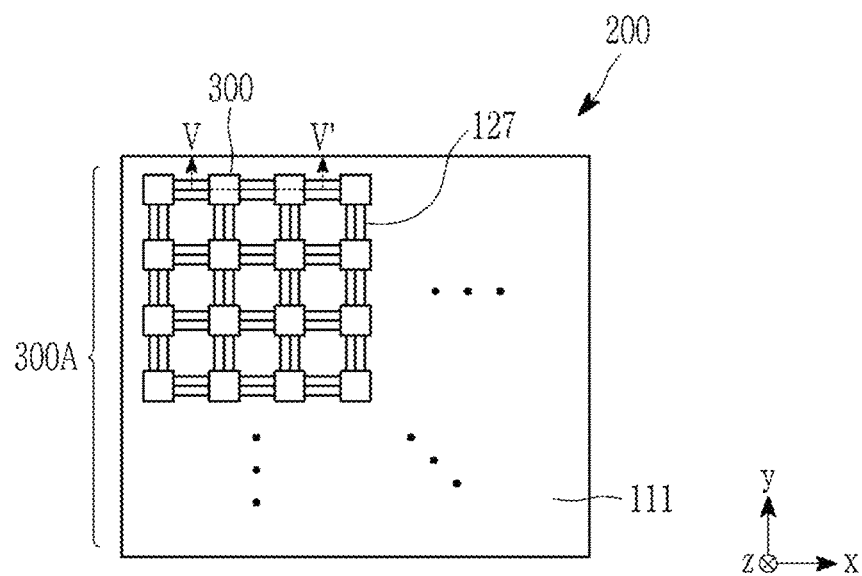
FIG. 4 is a plan view showing another example of a stretchable device according to some example embodiments.
Figure 5:
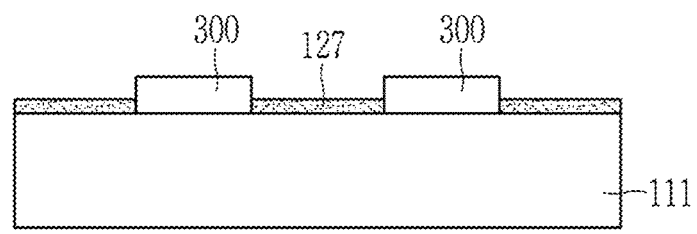
FIG. 5 is a cross-sectional view of the stretchable device of FIG. 4 taken along line V-V'.

FIG. 4 is a plan view showing another example of a stretchable device according to some example embodiments, and FIG. 5 is a cross-sectional view of the stretchable device of FIG. 4 taken along line V-V'.

Referring to FIGS. 4 and 5, the stretchable device 200 according to some example embodiments includes a stretchable substrate 111, a plurality of unit devices 300 arranged on the stretchable substrate 111, and a connection wiring 127 for connecting a plurality of unit devices 300.

The stretchable substrate 111 may be, for example, a support substrate including an elastic polymer, and may be, for example, a transparent support substrate.

The plurality of unit devices 300 are arranged on the stretchable substrate 111 and, for example, may be arranged along rows and/or columns to form an array 300A. The plurality of unit devices 300 may be arranged in, for example, a Bayer matrix, a PenTile matrix, and/or a diamond matrix, but is not limited thereto. The plurality of unit devices 300 may be the same as or different from each other. Each unit device 300 may include a light emitting device such as an organic light emitting device, an inorganic light emitting diode, a quantum dot light emitting diode, a micro light emitting diode or a perovskite light emitting diode; a light absorbing device such as a photoelectric conversion device; a transistor such as a thin film transistor; a resistance device; an imaging device, or a combination thereof, but is not limited thereto. Each unit device 300 may include a conductor such as an electrode, a semiconductor such as an active layer, an insulator, and the like, but is not limited thereto.

For example, each unit device 300 may include a light emitting device independently displaying red, green, and blue, or a combination thereof. For example, the light emitting device may include a pair of electrodes and a light emitting layer between the pair of electrodes and configured to emit light in a red wavelength spectrum, a green wavelength spectrum, a blue wavelength spectrum, or a combination thereof. For example, each unit device 300 may include a light absorbing device configured to absorb light in a red wavelength spectrum, a green wavelength spectrum, a blue wavelength spectrum, an infrared wavelength spectrum, or a combination thereof. For example, the light absorbing device may include a pair of electrodes and a light absorbing layer between the pair of electrodes and configured to absorb light in a red wavelength spectrum, a green wavelength spectrum, a blue wavelength spectrum, or a combination thereof. For example, the plurality of the unit devices 300 may include a plurality of the light emitting devices and a plurality of the light absorbing devices alternately arranged along a raw and/or a column.

For example, each unit device 300 may include one or more thin film transistors. The thin film transistor may include, for example, a switching transistor and/or a driving transistor. The switching transistor may be electrically connected to the gate line and the data line and may include a first gate electrode connected to the gate line; a first source electrode connected to the data line; a first drain electrode facing the first source electrode; and a first semiconductor which is respectively electrically connected to the first source electrode and the first drain electrode. The driving transistor may include a second gate electrode electrically connected to the first drain electrode; a second source electrode connected to the driving voltage line; a second drain electrode facing the second source electrode; and a second semiconductor which is respectively electrically connected to the second source electrode and the second drain electrode. For example, the first semiconductor and the second semiconductor may each include a semiconductor material and optionally an elastomer. For example, the first semiconductor and the second semiconductor may each include an organic semiconductor material and optionally an elastomer.

In the drawing, all the unit devices 300 are shown to have the same size but not limited thereto, and at least one unit device 300 may be smaller or larger than the other unit devices 300. In the drawing, all the unit devices 300 are shown to have the same shape but not limited thereto, and at least one unit device 300 may have a different shape from the other unit devices 300.

The connection wiring 127 may be between adjacent unit devices 300 to electrically connect adjacent unit devices 300. The connection wiring 127 may be one or at least two and arranged along a row direction (e.g., x direction) and a column direction (e.g., y direction) among the unit devices 300 arranged along a raw and/or a column. The connection wiring 127 may be connected to a signal line (not shown), and the signal line may include, for example, a gate line transferring gate signals (or scan signals), a data line transferring data signals, a driving voltage line applying a driving voltage, and/or a common voltage line applying a common voltage, but is not limited thereto.

For example, in the stretchable device 200 shown in FIGS. 4 and 5, a stacked structure of the stretchable substrate 111 and the connection wiring 127 may be the aforementioned stacked structure 100 for a stretchable device. That is, the stretchable substrate 111 may be the aforementioned stretchable layer 110 and the connection wiring 127 may be the aforementioned conductive layer 120.

For example, in the stretchable device 200 shown in FIGS. 4 and 5, a stacked structure of the stretchable substrate 111 and an electrode (not shown) in the unit device 300 may be the aforementioned stacked structure 100 for a stretchable device. In other words, the stretchable substrate 111 may be the aforementioned stretchable layer 110, and the electrode in the unit device 300 may be the aforementioned conductive layer 120.

The stretchable device 200 according to some example embodiments may flexibly respond to external force or external movement such as twisting, pressing, and pulling in a particular (or, alternatively, predetermined) direction by including the aforementioned stacked structure 100 for a stretchable device, and at the same time, damages caused by such external force or external movement may be effectively reduced or prevented, and an electrical passage may be stably secured, by increasing adhesion between the stretchable layer 110 and the conductive layer 120, thereby effectively increasing electrical stability according to stretching.

The aforementioned stretchable device 200 may be applied to (e.g., included in) various stretchable device systems requiring stretchability, and may be applied to (e.g., included in), for example, a display panel or a sensor. The stretchable device system may include, for example, a bendable display panel, a foldable display panel, a rollable display panel, a wearable device, and a skin-like display panel, a skin-like sensor, a large-area conformable display, smart clothing, etc., but the present inventive concepts are not limited thereto.

For example, the aforementioned stretchable device 200 may be included in a skin-like display panel.

Figure 6:
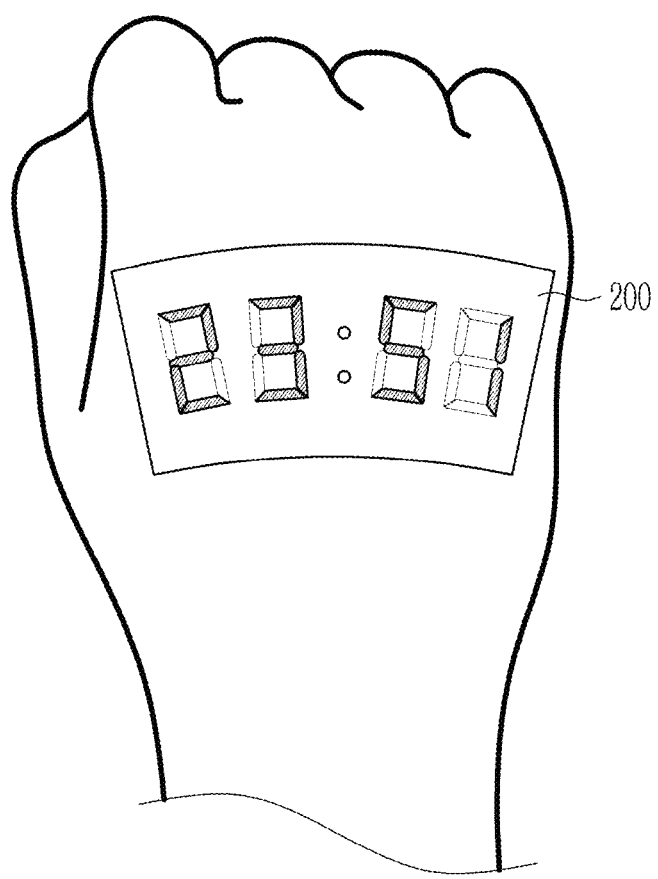
FIG. 6 is a schematic view illustrating an example of a skin-like display panel.
Figure 7A:
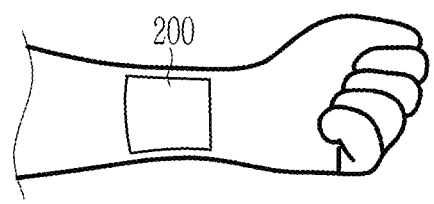
FIGS. 7A, 7B, 7C, and 8 are schematic views showing examples of biometric sensors.
Figure 7B:
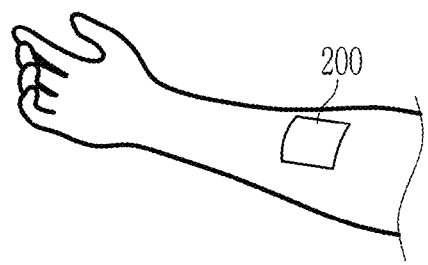
Figure 7C:
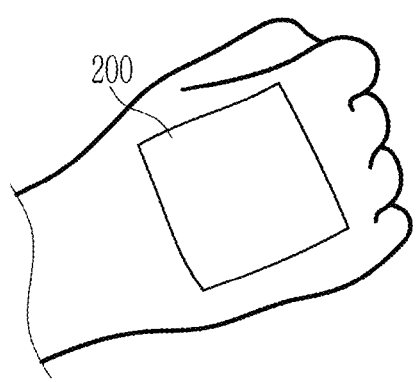
Figure 8:
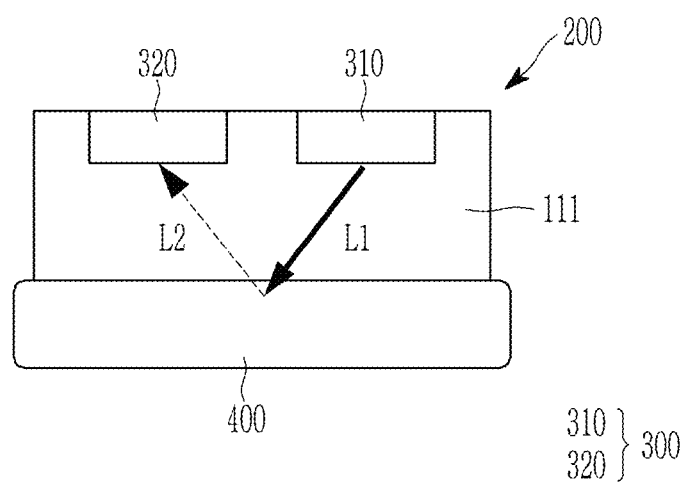

FIG. 6 is a schematic view illustrating an example of a skin-like display panel.

The stretchable device 200 may be a skin-like display panel, which is an ultrathin display panel, and may be attached to a part of a living body such as a hand. The skin-like display panel may display particular (or, alternatively, predetermined) information such as various letters and/or images. The skin-like display panel may include, for example, a light emitting device such as an inorganic light emitting diode, a micro light emitting diode, an organic light emitting diode OLED, a quantum dot light emitting diode, or a perovskite light emitting diode as the aforementioned unit device 300, but is not limited thereto.

As an example, the aforementioned stretchable device 200 may be included in a sensor such as a biometric sensor.

FIGS. 7A, 7B, 7C, and 8 are schematic views showing examples of biometric sensors.

The stretchable device 200 may be an attachable biometric sensor, and is attached to a living body surface such as skin, an internal body such as an organ, or an indirect means contacting a living body such as clothing to detect and measure biometric information such as a biometric signal. For example, a biometric sensor may be an electroencephalogram EEG sensor, an electrocardiogram ECG sensor, a blood pressure BP sensor, an electromyography EMG sensor, a diabetes (blood glucose, BG) sensor, a light blood flow photoplethysmography PPG sensor, an accelerometer, a RFID antenna, an inertial sensor, an activity sensor, a strain sensor, a motion sensor, or a combination thereof, but is not limited thereto. The biometric sensor is attached to the living body in an ultrathin patch type or band type, so that biometric information may be monitored in real time.

The stretchable device 200 may include a light emitting device 310 and a light absorbing device 320 as the aforementioned unit device 300. The light emitting device 310 may be configured to emit first light L1 for detecting a biosignal. The light emitting device 310 may be, for example, an infrared light emitting diode configured to emit first light L1 in an infrared wavelength spectrum and/or a visible light emitting diode configured to first light L1 in a visible light wavelength spectrum. The first light L1 emitted from the light emitting device 310 may be reflected by an object 400 (e.g., a living body such as skin or blood vessels) or absorbed in the object 400.

The light absorbing device 320 may be configured to receive second light L2 reflected by the object 400 from the first light L1 emitted from the light emitting device 310 and convert it into an electrical signal. The electrical signal converted from the second light L2 may include biometric information. The electrical signal including the biometric information may be transferred into a sensor IC (not shown) or a processor (not shown).

For example, the stretchable device 200 may be a photoplethysmography PPG sensor, and the biometric information may include a heart rate, oxygen saturation, stress, arrhythmia, a blood pressure, and the like, which may be obtained by analyzing a waveform of the electrical signal.

For example, the stretchable device 200 may be an electromyography EMG sensor or a strain sensor attached to a joint for a rehabilitation treatment of patients with joint and muscle problems. The electromyography EMG sensor or the strain sensor may be attached to an area requiring the treatment and thus secure data necessary for the rehabilitation by quantitatively measuring motions of muscles or joints.

The aforementioned stretchable device; or a stretchable device system such as a display panel and a sensor may be included in various electronic devices, and the electronic device may further include a processor (not shown) and a memory (not shown). The electronic device may be a mobile; TV; a health care device, and the like, and the health care device may be, for example, a photoplethysmography PPG sensor, an electroencephalogram EEG sensor, an electrocardiogram ECG sensor, a blood pressure BP sensor, an electromyography EMG sensor, a blood glucose BG sensor, an accelerometer device, a RFID antenna device, an inertial sensor, an activity sensor, a strain sensor, a motion sensor, or a combination thereof but is not limited thereto.

Figure 9:
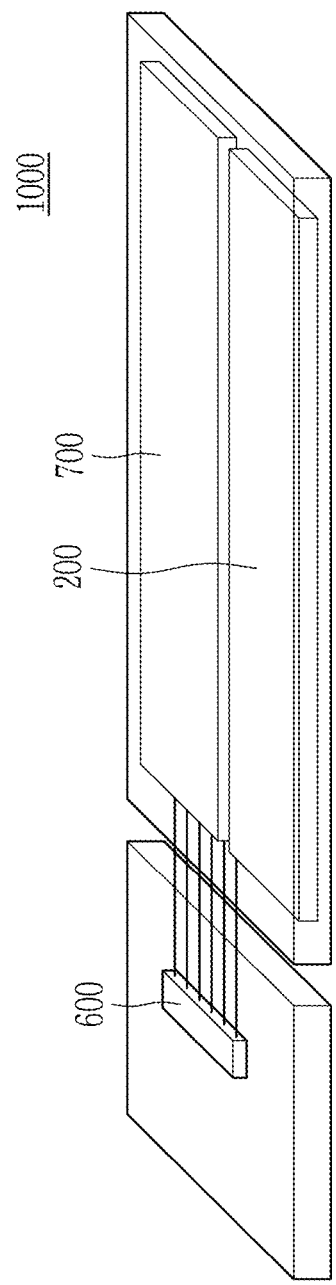
FIG. 9 is a schematic view showing an example of a health care device according to some example embodiments.

FIG. 9 is a schematic view showing an example of a health care device according to some example embodiments.

Referring to FIG. 9, the health care device 1000 according to some example embodiments may be a patch-type or band-type attachable heath care device and include the aforementioned stretchable device 200; an IC sensor and/or a processor 600 for processing biometric signals obtained from the stretchable device 200, and a display area 700 (e.g., a display panel, such as an organic light emitting diode (OLED) display screen) for displaying the obtained biometric signals into various letters and/or images. The display area and/or the IC sensor may include any of the display panels and/or sensors according to any of the example embodiments.

In some example embodiments, some or all of the devices and/or elements thereof as described herein with reference to any of the drawings (including without limitation the elements of the health care device 1000, the IC sensor and/or a processor 600, the display area 700, the stretchable device 200, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), an application processor (AP), a microcomputer, a field programmable gate array (FPGA), and programmable logic unit, a microprocessor, application-specific integrated circuit (ASIC), a neural network processing unit (NPU), an Electronic Control Unit (ECU), and the like. In some example embodiments, the processing circuitry may include a non-transitory computer readable storage device, for example a solid state drive (SSD), storing a program of instructions, and a processor (e.g., CPU) configured to execute the program of instructions to implement the functionality of any of the elements of the devices and/or elements thereof as described herein (including without limitation some or all of the health care device 1000 shown in FIG. 9).

Hereinafter, some example embodiments are illustrated in more detail with reference to examples. However, the present scope of the inventive concepts not limited to these examples.

Manufacture of Stacked Structure for Stretchable Device

Preparation Example 1

A solution in which styrene-ethylene-butylene-styrene (SEBS) including a styrene structural unit and an ethylene/butylene structural unit in a ratio of 20:80 (w/w) (Tg=60° C., H1052, Asahi Kasei Corp.) and a hardener are dissolved in toluene is coated on a glass substrate with a sacrificial layer, and then, drying, curing, and patterning it to form a 5 μm-thick stretchable substrate (an elongation: about 700%, an elastic modulus: about ~1 MPa). Subsequently, the stretchable substrate is put in a vacuum chamber, and then, Au is thermally deposited at a deposition rate of about 0.1 Å/s for about 5000 seconds by using a thermal depositor and a shadow mask to form a 50 nm-thick conductive layer and thus manufacture a stacked structure. Then, the glass substrate is separated and removed from the stretchable substrate.

Preparation Example 2

A stacked structure is manufactured according to the same method as Preparation Example 1 except that the conductive layer is formed by thermally depositing Au at a deposition rate of about 0.5 Å/s for about 1000 seconds.

Preparation Example 3

A stacked structure is manufactured according to the same method as Preparation Example 1 except that the conductive layer is formed by thermally depositing Au at a deposition rate of about 1 Å/s for about 500 seconds.

Preparation Example 4

A stacked structure is manufactured according to the same method as Preparation Example 1 except that the conductive layer is formed by thermally depositing Au at a deposition rate of about 4 Å/s for about 125 seconds.

Preparation Example 5

A stacked structure is manufactured according to the same method as Preparation Example 1 except that the conductive layer is formed by thermally depositing Au at a deposition rate of about 10 Å/s for about 50 seconds.

Evaluation I

Interfaces between the stretchable substrates and the conductive layers of the stacked structures according to the Preparation Examples are evaluated.

The interfaces between the stretchable substrates and the conductive layers are evaluated by using a focused ion beam (FIB) and transmission electron microscopy (TEM).

Figure 10:
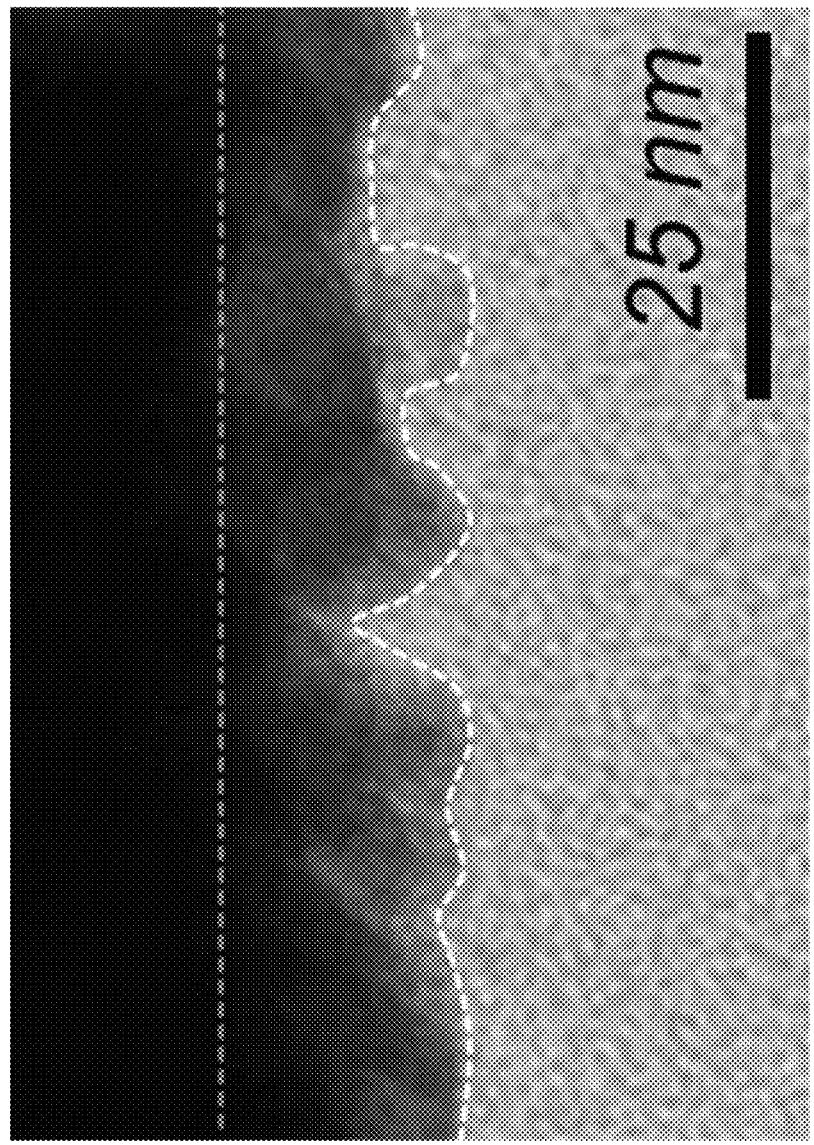
FIG. 10 is a TEM photograph showing an interface between a stretchable substrate and a conductive layer in the stacked structure according to Preparation Example 1.
Figure 11:
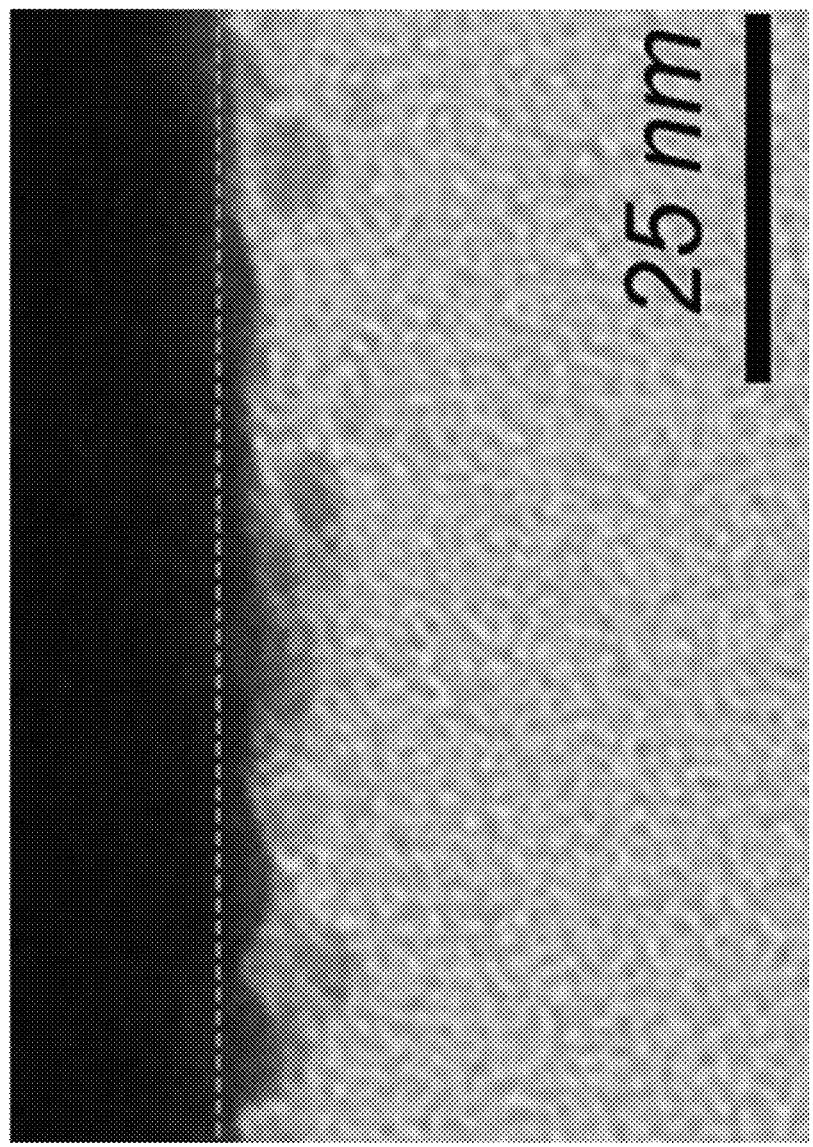
FIG. 11 is a TEM photograph showing an interface between a stretchable substrate and a conductive layer in the stacked structure according to Preparation Example 4.

FIG. 10 is a TEM image showing an interface between a stretchable substrate and a conductive layer in the stacked structure according to Preparation Example 1, and FIG. 11 is a TEM image showing an interface between a stretchable substrate and a conductive layer in the stacked structure according to Preparation Example 4.

Referring to FIGS. 10 and 11, in the stacked structure according to Preparation Example 1, metal atoms are penetrated and/or diffused through the upper surface of the stretchable substrate to a depth of about 10 nm to 30 nm from the surface of the stretchable substrate (red dot line) and form a metal cluster, but in the stacked structure according to Preparation Example 4, metal atoms are penetrated and/or diffused through the upper surface of the stretchable substrate to a depth of several nanometers (for example less than about 10 nm) and form a metal cluster.

Accordingly, when the metal for the conductive layer is thermally deposited, some of the metal is penetrated and/or diffused through the surface of the stretchable substrate, wherein an amount and a depth of the metal penetrated and/or diffused into the stretchable substrate may be adjusted according to a thermal deposition rate of the metal.

Evaluation II

In the stacked structures according to the Preparation Examples, component changes depending on depths of the stretchable substrates are evaluated.

The component changes depending on depths of the stretchable substrates are evaluated by using secondary ion mass spectrometry (SIMS) and X-ray photoelectron spectroscopy (XPS).

Figure 12:
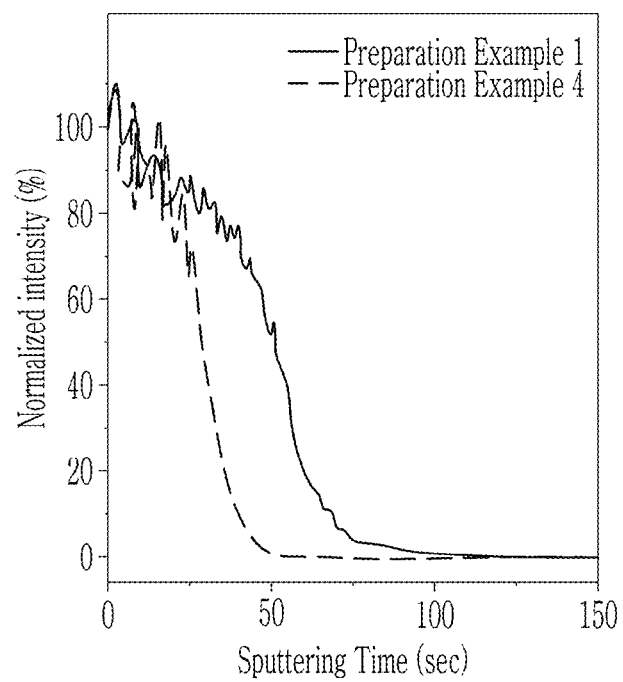
FIG. 12 is a graph showing changes in components according to depth from the surface of the stretchable substrate in the stacked structure according to the preparation example.

FIG. 12 is a graph showing changes in components according to depth from the surface of the stretchable substrate in the stacked structure according to Preparation Examples 1 and 4.

Referring to FIG. 12, in the stacked structures according to Preparation Examples 1 and 4, metal atoms are present from the surface of the stretchable substrate (sputtering time: 0 sec) to a particular (or, alternatively, predetermined) depth, and a depth that the metal atoms are penetrated and/or diffused into the stretchable substrate depending on a thermal deposition rate of the metal may be adjusted.

Evaluation I

The stacked structure according to the Preparation Example is 10% stretched, and then, surface morphology of the conductive layer is evaluated.

The surface morphology is evaluated by using an optical microscope.

Figure 13:
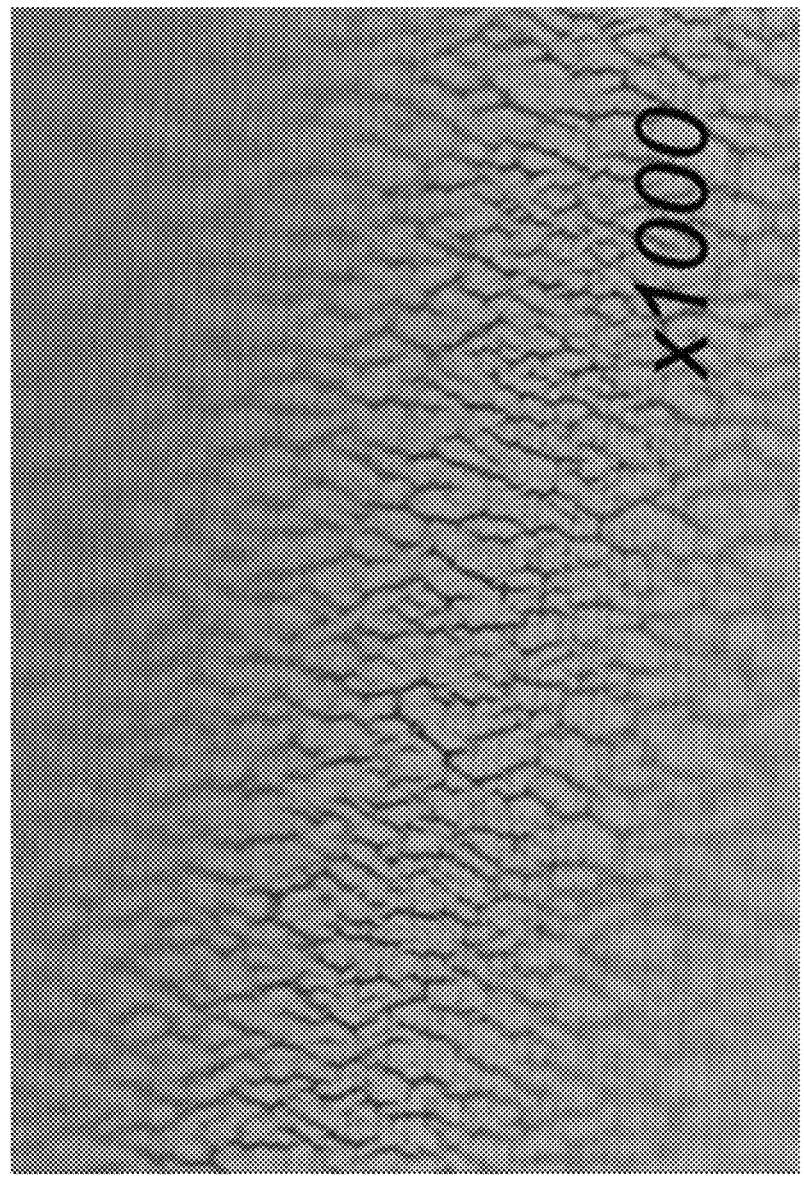
FIG. 13 is a photograph of the surface of the conductive layer of the stacked structure according to Preparation Example 1.

FIG. 13 is a photograph of the surface of the conductive layer of the stacked structure according to Preparation Example 1.

Referring to FIG. 13, in the stacked structure according to Preparation Example 1, it is confirmed that a plurality of microcracks are formed at the surface of the conductive layer.

Manufacture of Stretchable Device I

Example 1

A solution in which styrene-ethylene-butylene-styrene (SEBS) including a styrene structural unit and an ethylene/butylene structural unit in a ratio of 20:80 (w/w) (Tg=60° C., H1052, Asahi Kasei Corp.) and a hardener are dissolved in toluene is coated on a glass substrate with a sacrificial layer, and then, drying, curing, and patterning it to form a 5 µm-thick stretchable substrate (an elongation: about 700%, elastic modulus: about ~1 MPa). Subsequently, the stretchable substrate is put in a chamber, and then, Au is thermally deposited at a deposition rate of about 0.1 Å/s for about 5000 seconds with a thermal depositor and a shadow mask on the stretchable substrate to form a 50 nm-thick source electrode and drain electrode. Subsequently, an organic semiconductor solution prepared by mixing an organic semiconductor represented by Chemical Formula A and SEBS in a weight ratio of 3:7 is coated on the source electrode and the drain electrode and heat-treated it at 100° C. for 1 hour to form an organic semiconductor. Subsequently, a SEBS solution is coated on the organic semiconductor and annealed it at 100° C. for 0.5 hour to form a gate insulating layer, and then Au is thermally deposited on the gate insulating layer to manufacture a stretchable thin film transistor. Subsequently, the glass substrate is separated and removed from the stretchable substrate.

<Chemical Formula A>

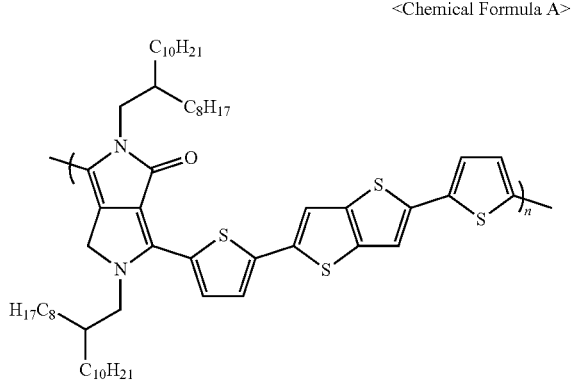

Example 2

A stretchable thin film transistor is manufactured according to the same method as Example 1 except that a source electrode and a drain electrode are formed by thermally depositing Au at a deposition rate of about 0.5 Å/s for about 1000 seconds.

Example 3

A stretchable thin film transistor is manufactured according to the same method as Example 1 except that a source electrode and a drain electrode are formed by thermally depositing Au at a deposition rate of about 1 Å/s for about 500 seconds.

Example 4

A stretchable thin film transistor is manufactured according to the same method as Example 1 except that a source electrode and a drain electrode are formed by thermally depositing Au at a deposition rate of about 4 Å/s for about 125 seconds.

Example 5

A stretchable thin film transistor is manufactured according to the same method as Example 1 except that a source electrode and a drain electrode are formed by thermally depositing Au at a deposition rate of about 10 Å/s for about 50 seconds.

Evaluation IV

Electrical characteristics of the stretchable thin film transistors according to the Examples depending on an elongation are evaluated.

The electrical characteristics are evaluated by using changes in charge mobility and contact resistance according to a stretching degree, when the stretchable thin film transistors according to the Examples are stretched up to 50% of the initial length in a channel length direction or a channel width direction and then, restored.

Figure 14:
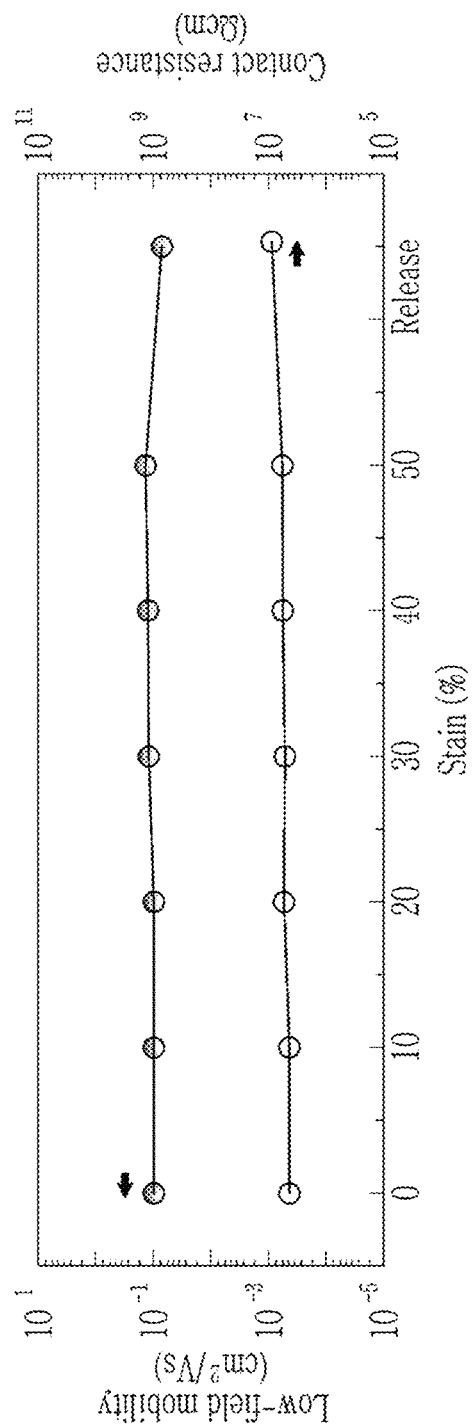
FIG. 14 is a graph showing changes in electrical characteristics according to an elongation when the stretchable thin film transistor according to Example 1 is stretched in the channel length direction.
Figure 15:
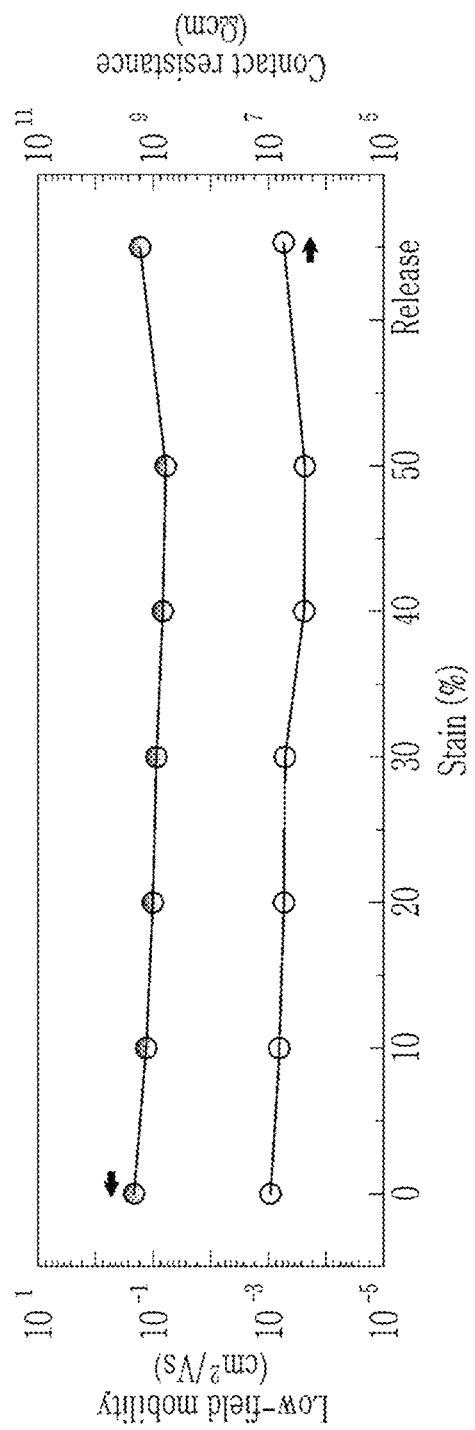
FIG. 15 is a graph showing changes in electrical characteristics according to an elongation when the stretchable thin film transistor according to Example 1 is stretched in the channel width direction.

FIG. 14 is a graph showing changes in electrical characteristics according to a stretching degree when the stretchable thin film transistor according to Example 1 is stretched in the channel length direction, and FIG. 15 is a graph showing changes in electrical characteristics according to a stretching degree when the stretchable thin film transistor according to Example 1 is stretched in the channel width direction.

Referring to FIGS. 14 and 15, the stretchable thin film transistor according to Example 1 exhibits almost no electrical characteristic change depending on a stretching degree, when stretched up to 50% of the initial length and restored. Accordingly, the stretchable thin film transistor of Example 1 exhibits high electrical stability without damage due to the stretching.

Evaluation V

Electrical characteristic changes of the stretchable thin film transistors according to the Examples depending on repeated stretchings are evaluated.

The electrical characteristics are evaluated from the changes in charge mobility and a threshold voltage according to the number of stretching, when the stretchable thin film transistors according to the Examples are 10000 times repetitively stretched in the channel length direction or the channel width direction.

Figure 16:
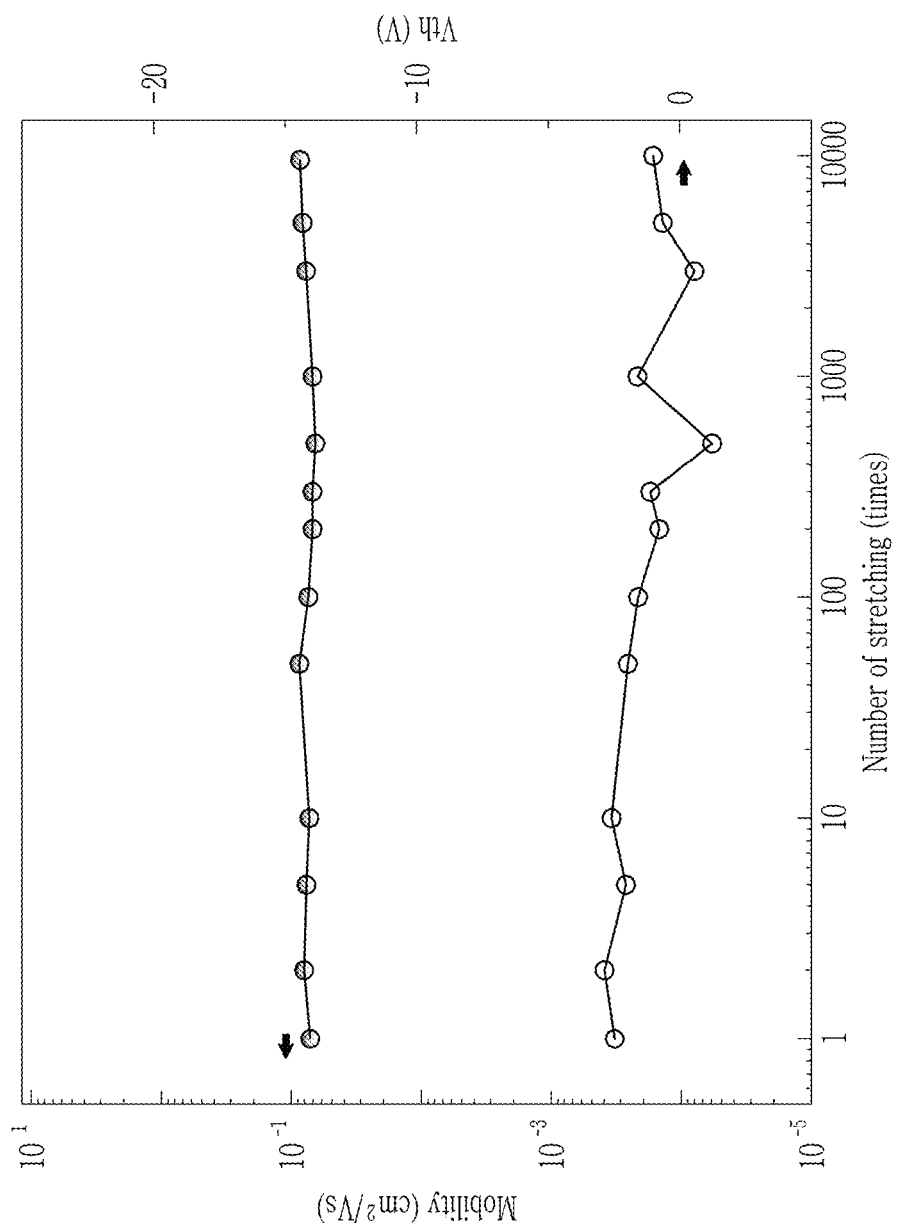
FIG. 16 is a graph showing changes in electrical characteristics according to the number of stretching when the stretchable thin film transistor according to Example 1 is repeatedly stretched in the channel length direction.
Figure 17:
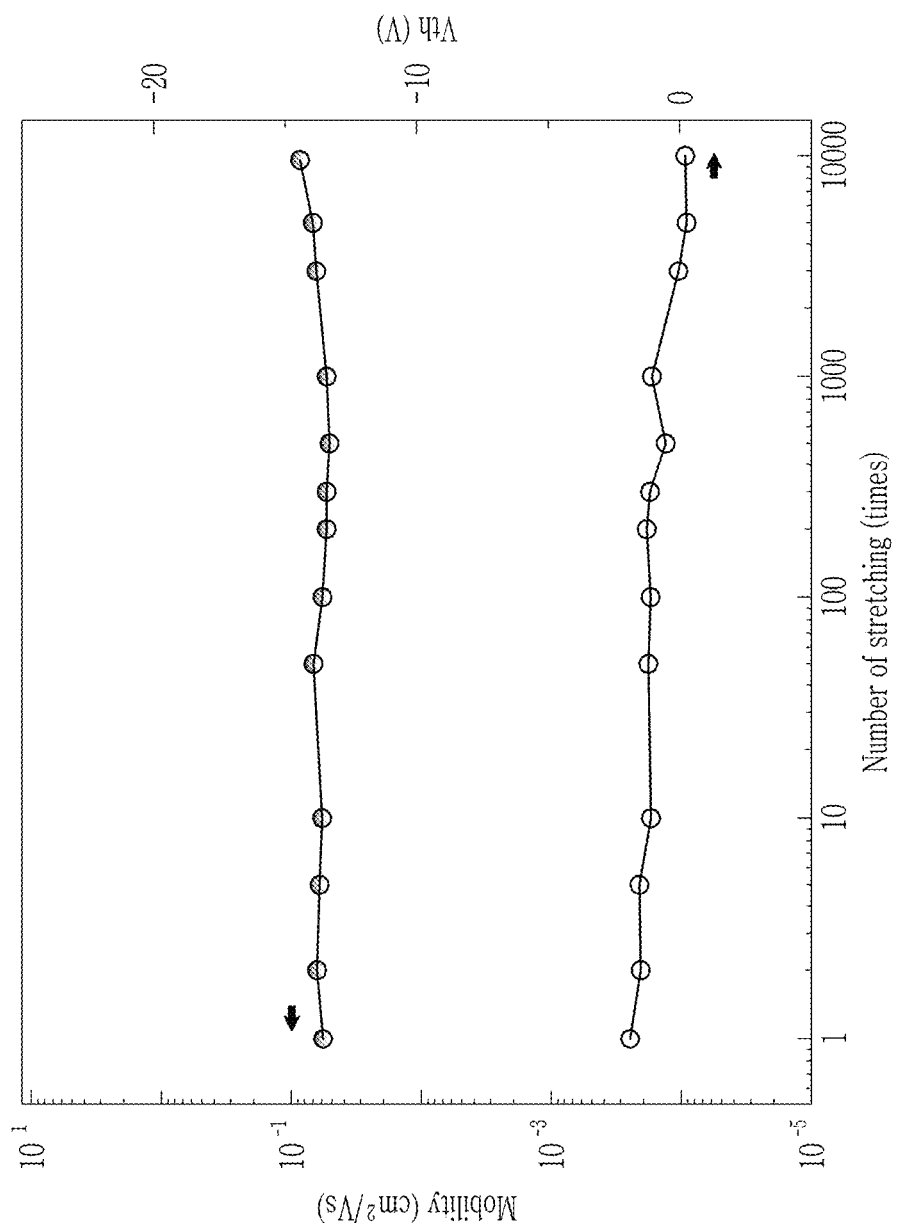
FIG. 17 is a graph showing changes in electrical characteristics according to the number of stretching when the stretchable thin film transistor according to Example 1 is stretched in the channel width direction.

FIG. 16 is a graph showing changes in electrical characteristics according to the number of stretching when the stretchable thin film transistor according to Example 1 is repeatedly stretched in the channel length direction, and FIG. 17 is a graph showing changes in electrical characteristics according to the number of stretching when the stretchable thin film transistor according to Example 1 is stretched in the channel width direction.

Referring to FIGS. 16 and 17, the stretchable thin film transistor according to Example 1 exhibits almost no electrical characteristic change, while 10000 times repetitively stretched. Accordingly, the stretchable thin film transistor according to Example 1 exhibits high electrical stability without damage due to repeated stretchings.

Manufacture of Stretchable Device II

Example 6

A solution in which styrene-ethylene-butylene-styrene (SEBS) including a styrene structural unit and an ethylene/butylene structural unit in a ratio of 20:80 (w/w) (Tg=80° C., H1052, Asahi Kasei Corp.) and a hardener are dissolved in toluene is coated on a glass substrate with a sacrificial layer and then, drying, curing, and patterning it to form a 5 μm-thick stretchable substrate (an elongation: about 700%, an elastic modulus: about −1 MPa). Subsequently, the stretchable substrate is put in a chamber, and Au is thermally deposited at a deposition rate of about 10 Å/s for about 50 seconds with a thermal depositor to form a 50 nm-thick conductive layer, manufacturing a strain sensor.

Evaluation VI

The strain sensor according to Example 6 is attached near a radial artery of the wrist and evaluated by using a change in resistance value according to motions.

Figure 18:
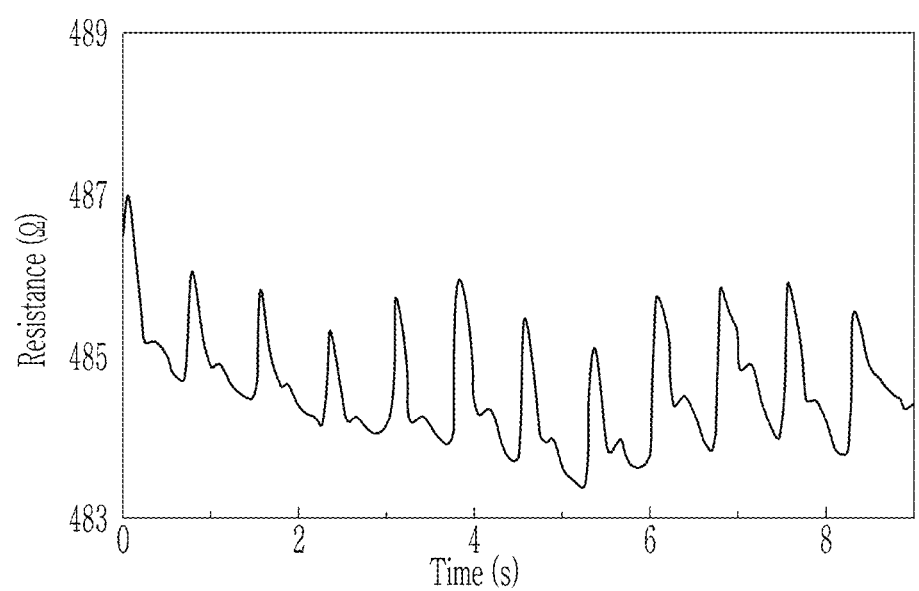
FIG. 18 is a graph showing a change in resistance value of the strain sensor according to Example 6.

FIG. 18 is a graph showing a change in resistance value of the strain sensor according to Example 6.

Referring to FIG. 18, the strain sensor according to Example 6 stably senses biometric signals (e.g., pulses) without being affected by the motions.

While the inventive concepts have been described in connection with what is presently considered to be practical example embodiments, it is to be understood that the inventive concepts are not limited thereto. On the contrary, the inventive concepts are intended to cover various modifications and equivalent arrangements included within the spirit and scope of the appended claims.

What is claimed is:

1. A stacked structure for a stretchable device, the stacked structure comprising:
    a stretchable layer, the stretchable layer including an elastic polymer; and
    a conductive layer on the stretchable layer, the conductive layer including a metal,
    wherein the stretchable layer includes a first depth region and a second depth region sequentially disposed in a depth direction from a surface of the stretchable layer that is in contact with the conductive layer,
    wherein metal atoms of the metal are penetrated or diffused into the elastic polymer in the first depth region such that the first depth region includes the metal, and
    the metal in the first depth region is in a form of metal clusters.

2. The stacked structure of claim 1, wherein a glass transition temperature of the elastic polymer is less than or equal to about 80° C. and greater than or equal to about −30° C.

3. The stacked structure of claim 2, wherein
    the elastic polymer is a copolymer comprising at least one hard structural unit and at least one soft structural unit, and
    a weight ratio of the hard structural unit to the soft structural unit is less than about 1 and greater than or equal to about 0.01.

4. The stacked structure of claim 3, wherein
    the hard structural unit comprises a styrene structural unit, an olefin structural unit, a urethane structural unit, an ether structural unit, or a combination thereof, and
    the soft structural unit comprises an ethylene structural unit, a propylene structural unit, a butylene structural unit, an isobutylene structural unit, a butadiene structural unit, an isoprene structural unit, or a combination thereof.

5. The stacked structure of claim 1, wherein the metal comprises gold, silver, copper, chromium, rhodium, palladium, ruthenium, osmium, iridium, platinum, an alloy thereof, or a combination thereof.

6. The stacked structure of claim 1, wherein a thickness of the first depth region is about 2 nm to about 100 nm.

7. The stacked structure of claim 1, wherein the conductive layer has a plurality of microcracks.

8. The stacked structure of claim 1, wherein the conductive layer is electrically connected to the metal in the first depth region of the stretchable layer.

9. A stretchable device comprising the stacked structure of claim 1.

10. The stretchable device of claim 9, wherein
    the stretchable layer is a stretchable substrate, and
    the conductive layer comprises an electrode, a wiring, or a combination thereof.

11. The stretchable device of claim 9, wherein
    the stretchable layer is a stretchable gate insulating layer, a stretchable interlayer, a stretchable passivation layer, a stretchable protective layer, a stretchable buffer layer, or a combination thereof, and
    the conductive layer comprises an electrode, a wiring, or a combination thereof.

12. The stretchable device of claim 9, further comprising:
    an active layer on or under the stacked structure,
    wherein the active layer comprises a light emitting layer, a light absorbing layer, a semiconductor, or a combination thereof.

13. A display panel comprising the stretchable device of claim 9.

14. A sensor comprising the stretchable device of claim 9.

15. An electronic device comprising the display panel of claim 13.

16. An electronic device comprising the sensor of claim 14.

17. A method of manufacturing the stretchable device of claim 1, the method comprising:
    preparing the stretchable layer comprising the elastic polymer; and
    thermally depositing the metal on the stretchable layer,
    wherein the thermally depositing of the metal includes
        penetrating or diffusing metal atoms of the metal into the stretchable layer to distribute the metal to a particular depth from the surface of the stretchable layer, and
        stacking the metal on the stretchable layer to form the conductive layer.

18. The method of claim 17, wherein the preparing of the stretchable layer comprises preparing a copolymer comprising at least one hard structural unit and at least one soft structural unit and having a glass transition temperature of less than or equal to about 80° C. and greater than or equal to about −30° C.

19. The method of claim 17, wherein the thermally depositing of the metal is performed in a deposition chamber where a temperature of the deposition chamber is equal to or higher than a glass transition temperature of the elastic polymer.

20. The method of claim 17, wherein in the thermally depositing of the metal, a temperature of the surface of the stretchable layer is equal to or higher than a glass transition temperature of the elastic polymer.

21. The method of claim 17, wherein in the thermally depositing of the metal, a thermal deposition rate is less than or equal to about 10 Å/s and greater than or equal to about 0.001 Å/s.

22. The method of claim 21, wherein in the thermally depositing of the metal, the thermal deposition rate is about 0.001 Å/s to about 1 Å/s.

23. The method of claim 17, further comprising:
forming an active layer under and/or on the stretchable layer or under and/or on the conductive layer,
wherein the active layer comprises a light emitting layer, a light absorbing layer, a semiconductor, or a combination thereof.

24. The method of claim 17, wherein
the stretchable layer is a stretchable substrate, and
the conductive layer comprises an electrode, a wiring, or a combination thereof.

25. The method of claim 17, wherein
the stretchable layer is a stretchable gate insulating layer, a stretchable interlayer, a stretchable passivation layer, a stretchable protective layer, a stretchable buffer layer, or a combination thereof, and
the conductive layer comprises an electrode, a wiring, or a combination thereof.

* * * * *